(12) United States Patent
Huang et al.

(10) Patent No.: US 8,519,254 B2
(45) Date of Patent: Aug. 27, 2013

(54) DEVICE AND METHOD FOR GENERATING ELECTRICAL POWER

(75) Inventors: James Ping Huang, Huntington Beach, CA (US); Ching-Fen Tsai, Cypress, CA (US); Han V. Nguyen, Buena Park, CA (US); Mark Allen Cleveland, Westminster, CA (US); Jimmy M. Quiambao, Walnut, CA (US)

(73) Assignee: The Boeing Company, Chicago, IL (US)

( * ) Notice: Subject to any disclaimer, the term of this patent is extended or adjusted under 35 U.S.C. 154(b) by 448 days.

(21) Appl. No.: 12/099,291

(22) Filed: Apr. 8, 2008

(65) Prior Publication Data

US 2009/0250091 A1  Oct. 8, 2009

(51) Int. Cl.
*H01L 35/32* (2006.01)

(52) U.S. Cl.
USPC ................... 136/230; 136/205; 136/208

(58) Field of Classification Search
USPC ............. 136/200–242; 431/1–365; 432/103, 432/247; 110/101–349
See application file for complete search history.

(56) References Cited

U.S. PATENT DOCUMENTS

| | | | | |
|---|---|---|---|---|
| 3,056,701 A * | 10/1962 | Fritzlen | ........................ | 102/202 |
| 3,056,848 A | 10/1962 | Meyers | | |
| 3,185,201 A * | 5/1965 | Herbst et al. | .................... | 122/23 |
| 3,269,873 A * | 8/1966 | Dent | .............................. | 136/208 |
| 3,306,782 A | 2/1967 | Howard et al. | | |
| 4,129,003 A * | 12/1978 | Smith, Jr. | ........................ | 60/645 |
| 4,218,266 A | 8/1980 | Guazzoni et al. | | |
| 5,609,032 A * | 3/1997 | Bielinski | ........................... | 62/3.7 |
| 6,034,318 A * | 3/2000 | Lycke et al. | ................... | 136/205 |
| 6,233,944 B1 | 5/2001 | Yamada et al. | | |
| 2003/0209802 A1 | 11/2003 | Awano | | |
| 2004/0005736 A1 | 1/2004 | Searls et al. | | |
| 2004/0076214 A1 | 4/2004 | Bell | | |
| 2004/0099304 A1 * | 5/2004 | Cox | ............................... | 136/253 |
| 2005/0126618 A1 | 6/2005 | Muller-Werth | | |

FOREIGN PATENT DOCUMENTS

| | | |
|---|---|---|
| EP | 1571718 | 9/2005 |
| JP | 07123758 | 5/1995 |
| JP | 07221352 | 8/1995 |
| WO | 01/80325 | 10/2001 |

OTHER PUBLICATIONS

International Search Report, corresponding to International Patent Application No. PCT/US2008/078969, dated Oct. 19, 2009.

(Continued)

*Primary Examiner* — Jonathan Johnson
*Assistant Examiner* — Christina Chern
(74) *Attorney, Agent, or Firm* — Charles L. Moore; Moore and Van Allen PLLC

(57) ABSTRACT

A mobile device for generating electrical power may include a combustion chamber and a heat sink. A TEC module is in thermal communication with the combustion chamber and the heat sink to transfer thermal energy from the combustion chamber to the heat sink. A heat flux across the TEC module causes electrical power to be generated. The mobile device may also include a fuel delivery system to feed fuel into the combustion chamber. A control system may be included to at least monitor and control delivery of fuel to the combustion chamber by the fuel delivery system and to control a temperature gradient across the TEC module to control the electrical power produced by the thermal-to-electric energy conversion device.

10 Claims, 15 Drawing Sheets

(56) References Cited

OTHER PUBLICATIONS

Written Opinion, corresponding to International Patent Application No. PCT/US2008/078969, dated Oct. 19, 2009.
Crane, D.T. et al. "Progress Towards Maximizing the Performance of a Thermoelectric Power Generator." BSST, LLC, 5462 Irwindale Ave., Irwindale, CA 91706.
Gomez, Alessandro et al. "From jet fuel to electric power using a mesoscale, efficient Stirling cycle." Proceedings of the Combustion Institute 21 (2007) 3251-3259.
Radebaugh, Ray et al. "Measurement of High Efficiency in Hg0.86Cd0.14Te Thermionic Converters." Physical and Chemical Properties Division, National Institute of Standards and Technology, Boulder Colorado 80305, Dec. 7, 2001.
Wickman, John. "Using Lunar Soil for Propellants & Concrete." Ad Astra—Mar./Apr. 2002 (vol. 14, No. 2), http://www.wickmanspacecraft.com/moon1.html.
European Patent Office, PCT Invitation to Pay Additional Fees for International Application No. PCT/US2009/034613 dated Jan. 5, 2011.

* cited by examiner

DEVICE AND METHOD FOR GENERATING ELECTRICAL POWER

CROSS-REFERENCE TO RELATED APPLICATIONS

This application is related to application Ser. No. 11/937,571, filed Nov. 9, 2007, and entitled "DEVICE AND METHOD FOR GENERATING ELECTRICAL POWER."

BACKGROUND OF THE INVENTION

The present invention relates to devices and systems for generating electrical power, and more particularly to a mobile device and method for generating electrical power using a thermal-to-electrical energy conversion device including and a control unit.

At present, there are many ways of generating power for use in powering electronic devices. Most prevalent is the use of direct current or alternating current by means of a battery supply. Battery supplied power is limited and requires recharging. Recharging requires access to a power supply. Moreover, battery supplied power can be heavy as batteries become increasingly heavier as the power requirement increases. For example a battery having a higher power output will typically be heavier than one having a lower power output. Some batteries are lighter than others depending upon the materials used, but increase relatively in weight and size as the power requirements increase.

In some situations, there is a need for a continuous power supply for use in powering personal electronic devices, such as a cell phone or personal digital assistant, or the like. In particular, there is a need for a power supply for use in powering electronic devices used remotely, primarily by military and rescue personnel. Presently, portable power systems do not provide sufficient power for an extended period of time. Thus, additional power supplies must be carried as back-up power supplies, or a recharging system requiring access to electricity.

Thus, there is a need for a mobile, light weight, compact, sustainable power supply.

BRIEF SUMMARY OF THE INVENTION

In accordance with an embodiment of the present invention, a mobile device for generating electrical power may include a combustion chamber and a heat sink. A thermal-to-electric conversion (TEC) module is in thermal communication with the combustion chamber and the heat sink to transfer thermal energy from the combustion chamber to the heat sink. A heat flux across the TEC module causes electrical power to be generated. The mobile device may also include a fuel delivery system to feed fuel into the combustion chamber. A control system may be included to at least monitor and control delivery of fuel to the combustion chamber by the fuel delivery system and to control a temperature gradient across the TEC module to control the electrical power produced by the thermal-to-electric energy conversion device.

In accordance with another embodiment of the present invention, a mobile device for generating electrical power may include a combustion chamber. The device may also include a first hot plate in thermal communication with one side of the combustion chamber and a first cold plate. A first TEC module is disposed between the first hot plate and the first cold plate and in thermal communication with the first hot plate and the first cold plate to transfer thermal energy from the first hot plate to the first cold plate. A heat flux across the first TEC module causes electrical power to be generated. The device may also include a second hot plate in thermal communication with another side of the combustion chamber and a second cold plate. A second TEC module is disposed between the second hot plate and the second cold plate and in thermal communication with the second hot plate and the second cold plate to transfer thermal energy from the second hot plate to the second cold plate. Heat flux across the second TEC module also causes electrical power to be generated. The device may also include a magnesium wire fuel supply and a magnesium wire feed system to feed the magnesium wire into the combustion chamber. A control system may maintain a substantially constant temperature gradient across the TEC modules to provide a substantially uniform power output.

In accordance with another embodiment of the present invention, a mobile device for generating electrical power may include a bird's nest combustion chamber. The device may also include a hot plate thermally coupled to the bird's nest combustion chamber and a cold plate. A plurality of TEC modules may each disposed between the hot plate and the cold plate and in thermal communication with the hot plate and the cold plate to transfer thermal energy from the hot plate to the cold plate to generate electrical energy. The bird's nest combustion chamber and the hot plate may include a structure for substantially an even distribution of heat energy to each of the TEC modules.

In accordance with another embodiment of the present invention, a mobile electrically powered apparatus includes electrical circuitry to perform a predetermined function. The apparatus may also include a mobile device for generating and supplying power to the mobile apparatus to operate the electrical circuitry. The mobile device may include a combustion chamber and a heat sink. A TEC module is in thermal communication with the combustion chamber and the heat sink to transfer thermal energy from the combustion chamber to the heat sink. A heat flux across the TEC module causes electrical power to be generated. The device may also include a fuel delivery system to feed fuel into the combustion chamber. A control system may monitor and control delivery of fuel to the combustion chamber by the fuel delivery system. The control system may also control a temperature gradient across the TEC module to control the electrical power produced by the thermal-to-electric energy conversion device.

In accordance with another embodiment of the present invention, method for generating electrical power may include generating electrical power by creating a heat flux across a TEC module. The method may also include controlling a temperature gradient across the TEC module to provide a substantially uniform power output. Controlling the temperature gradient may include at least one of: controlling a feed rate of fuel into a combustion chamber of a device for generating electrical power and controlling a flow of cooling air across a heat sink thermally coupled to the TEC module.

Other aspects and features of the present invention, as defined solely by the claims, will become apparent to those ordinarily skilled in the art upon review of the following non-limited detailed description of the invention in conjunction with the accompanying figures.

DETAILED DESCRIPTION OF THE INVENTION

The following detailed description of embodiments refers to the accompanying drawings, which illustrate specific embodiments of the invention. Other embodiments having different structures and operations do not depart from the scope of the present invention.

Figure 1:
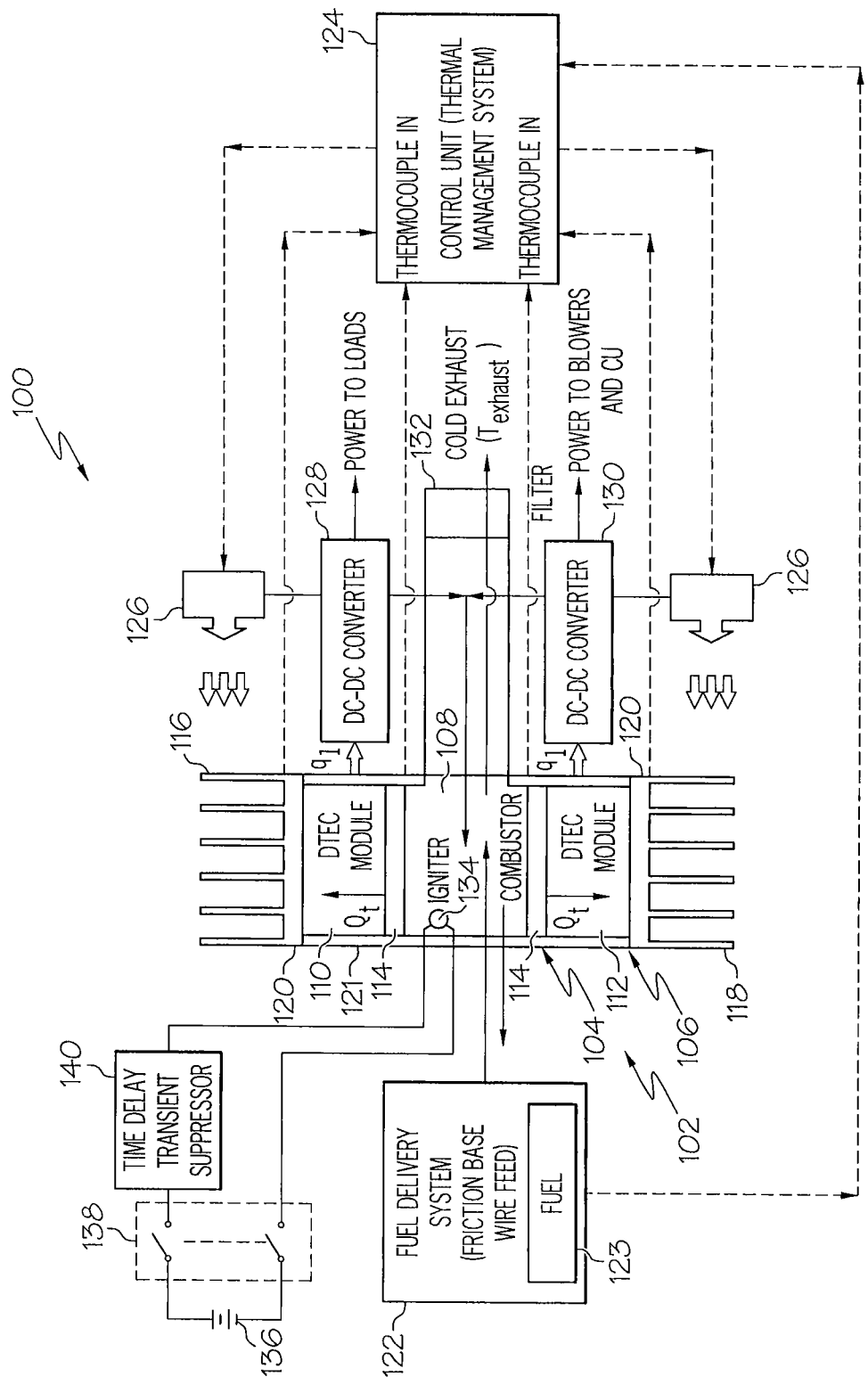
FIG. 1 is a block schematic diagram of an exemplary device for generating electrical power including a control unit or system in accordance with another embodiment of the present invention.

FIG. 1 is a block diagram of an example of a device 100 for generating electrical power in accordance with an embodiment of the present invention. As described herein different embodiments of the present invention may mobile and capable of being carried by personnel for powering electrical apparatus in remote areas where other power sources are unavailable. The device 100 may include a heat exchanger 102 including two concentric pipes or tubes 104 and 106. An inner pipe 104 of the two concentric pipes may form or define a combustion chamber 108. The two concentric pipes may be made from a high-heat resistant material, such as a metallic material, ceramic or other high-heat resistant material. A first thermal-to-electric conversion (TEC) module 110 or Direct Thermal-Electric Conversion (DTEC) module or plurality of modules may be positioned or disposed on one side of the combustion chamber 108, and a second TEC module 112 or plurality of modules may be disposed on another side or on an opposite side of the combustion chamber 108. The TEC or DTEC modules may each be thermal semiconductor chips such as those manufactured by ENECO, Inc. of Salt Lake City, Utah. Each of the TEC modules 110 and 112 are thermally coupled to or in thermal communication with the combustion chamber 108 to receive heat energy from the combustion chamber 108. A hot plate 114 may be disposed between the combustion chamber 108 and each TEC module 110 and 112 to substantially evenly distribute the heat from the combustion chamber 108 to each of the TEC modules 110 and 112.

A first heat sink 116 may be disposed on the first TEC module 110 and a second heat sink 118 may be disposed on the second TEC module 112. The first and second heat sinks 116 and 118 may each be an air cooled fin heat sink. In accordance with an embodiment of the present invention, a cold plate 120 may be disposed between each of the thermal-to-electric modules 110 and 112 for efficient transfer of heat from each of the modules 110 and 112 to the respective associated heat sinks 116 and 118. The first heat sink 116 is thermally coupled to or in thermal communication with the first TEC module 110 and the second heat sink 118 is thermally coupled to or in thermal communication with the second TEC module 112. Thus, thermal energy is efficiently transferred from the combustion chamber 108 to each the heat sinks 116 and 118 through the first and second TEC modules 110 and 112 causing a temperature differential ($\Delta T$), thermal gradient or heat flux across each of the TEC modules 110 and 112. The temperature differential, thermal gradient or heat flux causes electrical power to be generated by each of the TEC modules 110 and 112.

A layer 121 of insulation material may be disposed between the combustion chamber 108 and each of the heat sinks 116 and 118. The layer 121 of insulation material 121 may insulate the ends of each of the TEC modules 110 and 112 to isolate thermal energy flow through the TEC modules 110 and 112 rather than any other possible paths in the device 100 resulting in parasitic losses.

The device 100 may also include a fuel delivery system 122 to controllably feed fuel 123 into the combustion chamber 108. As described in more detail herein, the rate fuel is feed into the combustion chamber 108 may be adjusted to control the thermal gradient or heat flux across the TEC modules 110 and 112 to control the electrical power produced by the device 100. The fuel delivery system 122 may include a friction wire feed system to feed magnesium wire fuel 123 into the combustion chamber 108 at a controlled rate. The fuel delivery system 122 may be controlled by a control unit 124 as described below.

The device 100 for generating electrical power may also include an air blower 126 or cooling fan, or an air blower 126 or cooling fan for each heat sink 116 and 118. Each air blower 126 may respectively blow cooling air over the air cooling fins of the heat sinks 116 and 118. The air blowers 126 may be controlled to adjust the flow of cooling air over the air cooling fins of the heat sinks 116 and 118 to provide additional control of the thermal gradient or heat flux across the TEC modules 110 and 112 to control the electrical power produced by the device 100, or to produce a substantially constant or uniform power output. As described in more detail herein, the control unit 124 may also monitor and control a thermal management system. The thermal management system may control operation of each of the blowers 126. Thermocouples sensing temperature of each of the hot plates 114 and cold plates 120 may provide data to the control unit 124 for controlling the air blowers 126. A speed of the blowers 126 may be adjusted or the blowers may be turned on and off to control the temperature gradient across the TEC modules 110 and 112 or difference in temperature ($\Delta T$) between the associated pairs of hot plates 114 and cold plates 120.

The device 100 may also include one or more direct current to direct current (DC-DC) converters 128 and 130. For example, one DC-DC converter 128 may supply electrical power to loads or apparatus being powered by the device 100. Another DC-DC converter 130 may supply electrical power to the air blowers 126, the fuel delivery system 122 and the control unit 124. Examples of loads or apparatus that may be powered by the device 100 may include any mobile electrical devices, mobile communications devices, mobile computing devices or the like. As described in more detail herein different embodiments of the present invention are designed to be compact and lightweight so that they can be easily carried by personnel for use in the field for long periods of time compared to other heavier and shorter-life power supplies such as batteries.

In accordance with an embodiment of the present invention, the heat exchanger 102 may include a structure to duct ambient air into the combustion chamber 108 and to exhaust hot gases produced by combustion. As previously discussed, the heat exchanger 102 may include a two-concentric pipe or tube 104 and 106 structure. This structure may be configured to use hot exhaust gases from the combustion chamber to warm the cold air supply entering the combustion chamber to increase combustion efficiency, and to also use the cold air supply to cool the hot exhaust gases before being vented. The cooled exhaust gases may be filtered by a high efficiency particulate air (HEPA) filter 132 before being discharged into the outside air.

The combustion chamber 108 may include an igniter 134 to ignite the fuel 123 in the combustion chamber 108 to generate heat. Examples of igniters that may be used for igniter 134 will be described in more detail with reference to FIGS. 4 and 5. The igniter 134 may be powered by a battery 136. The battery 136 may be connected to the igniter 134 by a double pole single throw (DPST) switch 138. A time delay and transient suppressor circuit 140 may be connected between one side of the switch 138 and the igniter 134 to provide a time delay when starting the device 100 and to suppress any transients that may damage the igniter 134.

Figure 2:
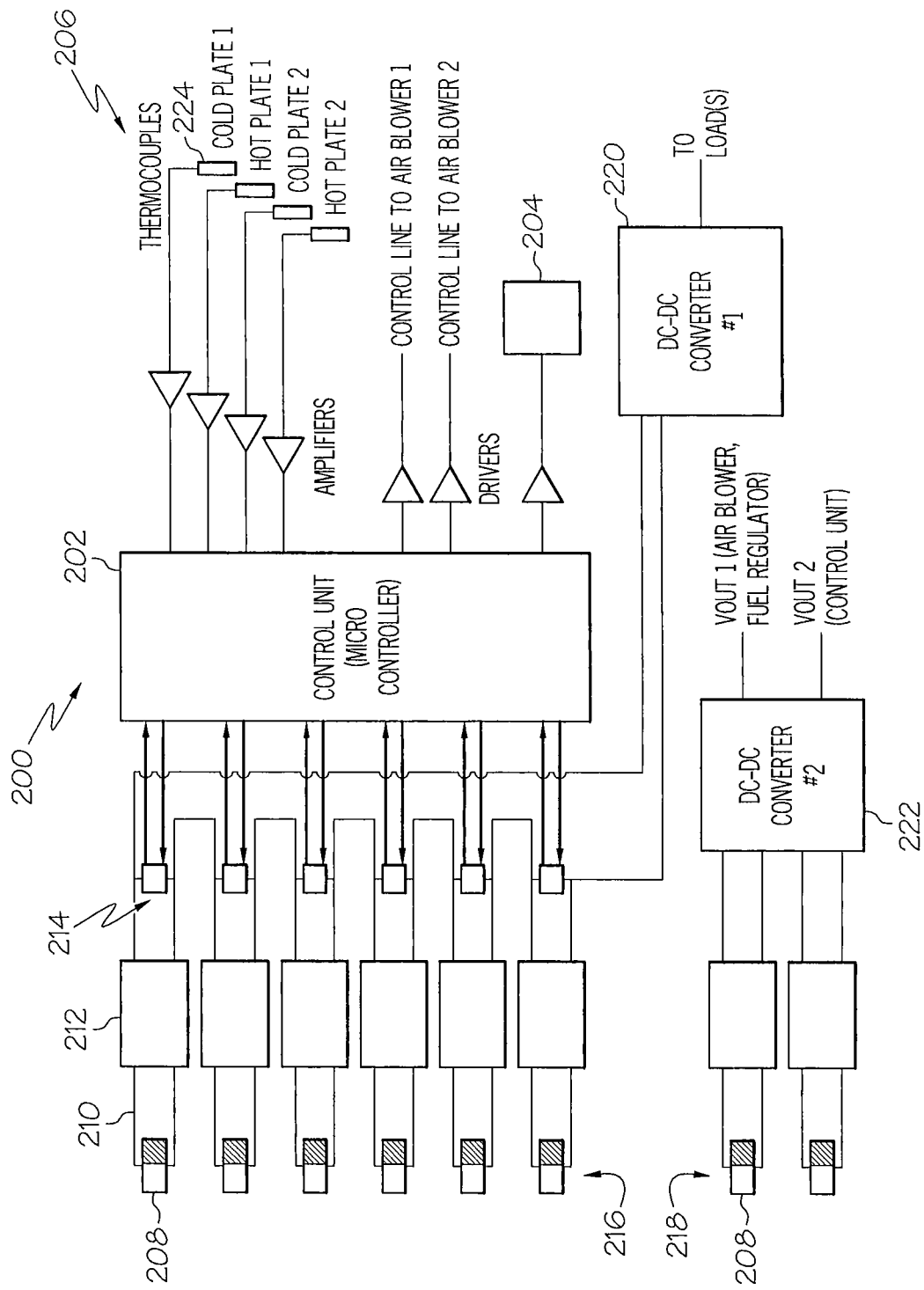
FIG. 2 is a block schematic diagram of an electrical power and control system in accordance with an embodiment of the present invention.

FIG. 2 is a block schematic diagram of an example of an electrical power and control system 200 in accordance with an embodiment of the present invention. The electrical power and control system 200 may be used with the device 100 of FIG. 1 to monitor and control operation of the device 100. The system 200 may include a control unit 202. The control unit 202 may be the same as the control unit 124 of FIG. 1. The control unit 202 may be a standard microcontroller or similar programmable electronic control device. The control unit 202 may provide functional management for the overall system or mobile power generation device, such as device 100. The control unit 202 may be programmed to monitor and control a fuel delivery system 204 or fuel regulator, a thermal management system 206, combustor performance, electrical power generation and delivery as well as other functions associated with efficient operation of mobile power generation devices, such as the embodiments of the present invention described herein. The fuel delivery system 204 may be similar to the fuel delivery system 122 of FIG. 1 and those systems described with reference to FIGS. 4 and 5.

A plurality of TEC modules 208 are illustrated in FIG. 2. The TEC modules 208 may be the same as TEC modules 110 and 112 of FIG. 1. Each of the TEC modules 208 may be connected through low-loss conductors 210 to an input of a high-efficiency chopper converter section 212 or sync rectifier. Each chopper converter section 212 may utilize high-power, low-loss Metal-Oxide-Silicon-Field-Effect-Transistor (MOSFET) devices (not shown in FIG. 2) that are driven by matched gate drive circuitry (not shown). The outputs of the MOSFETs may be coupled to high-efficiency transformers 214 that are chosen for the required power levels expected to be generated by the TEC modules 208. A transformer coupling allows full utilization of the power output from each TEC module 208 and electrically isolates all system components. The output of each chopper converter transformer 214 will be converted back to DC using a synchronous rectifier technique to minimize rectification losses. DC outputs of each chopper converter 212 will be connected in series to sum to a desired voltage level that may be required by the particular electrical apparatus being powered by power generation device 100. Voltage regulation of the total output voltage from the converter system may be filtered from the high voltage output point, comparing it to a voltage standard, and using this information to control a pulse width modulator applied to MOSFET controllers on the high voltage output circuit.

The TEC modules 208 may be divided into two groups 216 and 218. The first group 216 of TEC modules 208 may be a larger group. The first group 216 may be coupled thought a first DC-DC converter 220 to supply electrical power to a load or loads, such as an electrically powered apparatus or device. The second group 218 of TEC modules 218 may be coupled through a second DC-DC converter 222 to supply electrical power to the air blowers, such as blowers 126 in FIG. 1, the fuel delivery system 204 or fuel regulator, and the control unit 202.

One primary control element for the unit 202 is to maintain a desirable $\Delta T$ range between the hot and cold plates, such as hot and cold plates 114 and 120 of FIG. 1. The right amount of fuel-to-air mixture is necessary to deliver the desired hot plate temperatures. The control unit 202 monitors the $\Delta T$ temperature through thermocouples 224 sensing the temperature at each of the hot and cold plates. The control unit 202 may adjust the $\Delta T$ temperature to a predetermined value using active control where the control unit 202 reads the fuel consumption and readjusts the corresponding fuel-to-air ratio to control the combustion rate and thermal energy produced. The control unit 202 may also turn the blowers or cooling fans on and off or control the fan speed as required to maintain a desirable $\Delta T$ range. Controlling the thermal energy produced controls the electrical power produced. Maintaining a uniform or substantially constant production of thermal energy will generate a uniform or substantially constant electrical power output.

Figure 3A:
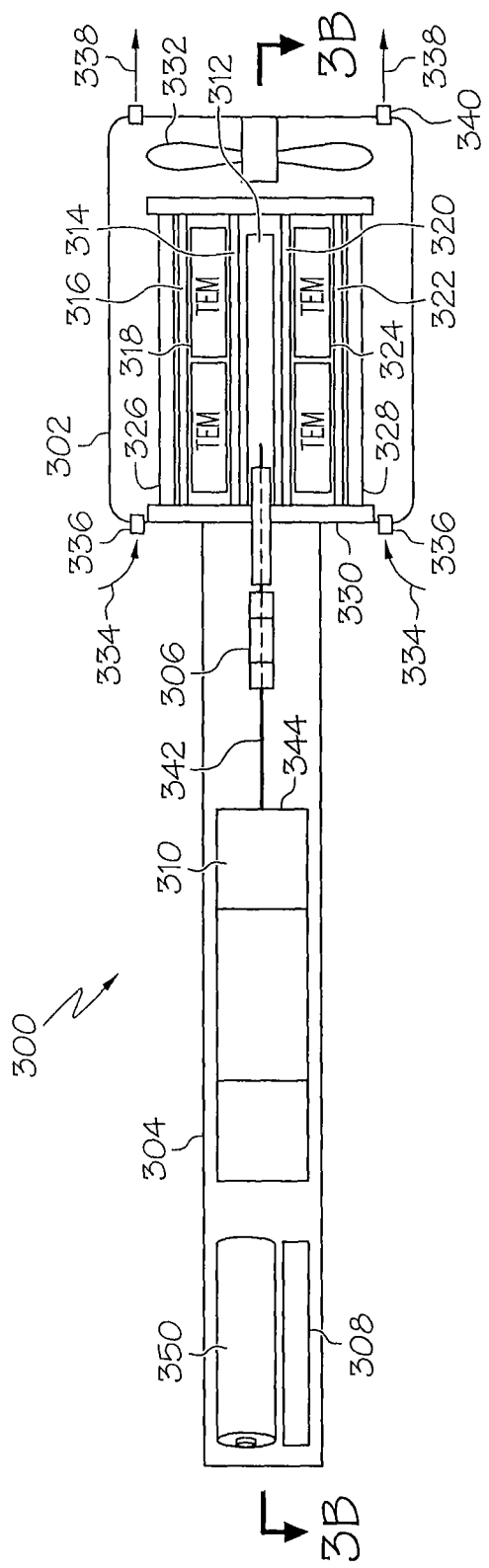
FIG. 3A is a side elevation view an example of a mobile device for generating electrical power in accordance with an embodiment of the present invention.
Figure 3B:
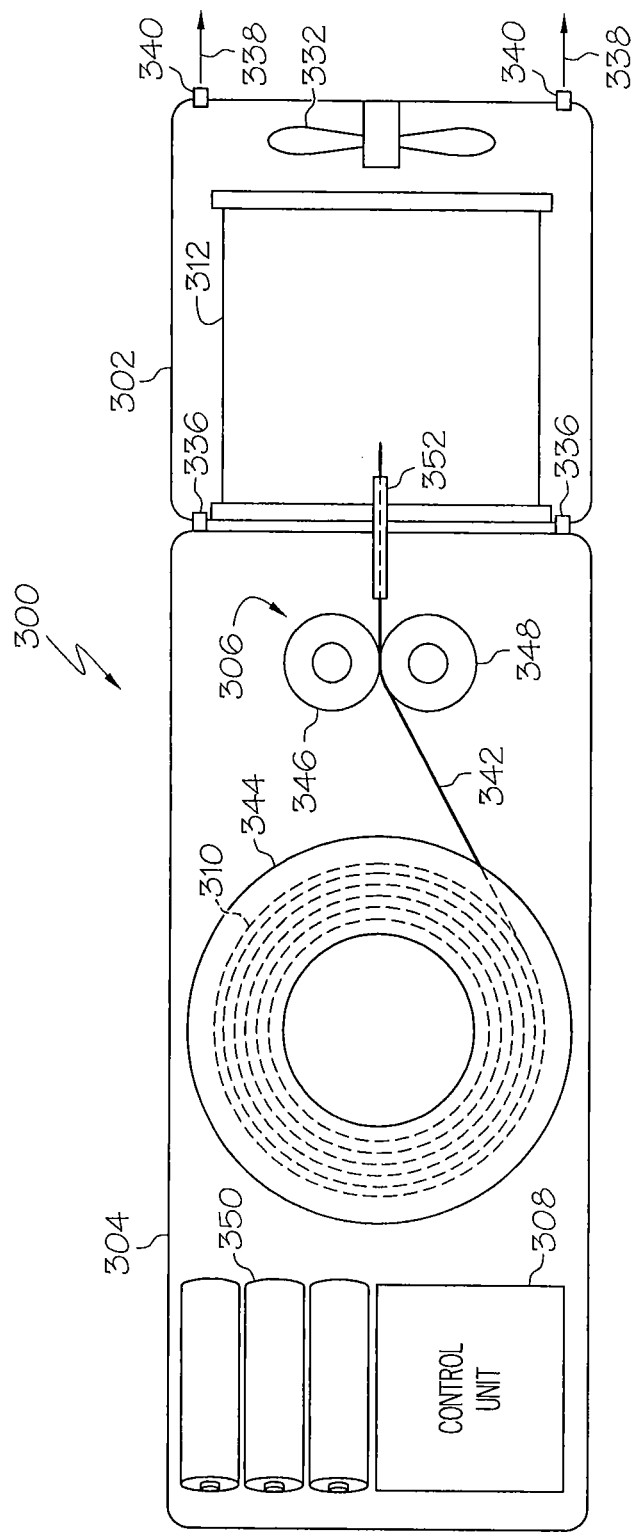
FIG. 3B is a cross-sectional view of the mobile device of FIG. 3A taken along lines 3B-3B.

FIG. 3A is a side elevation view an example of a device 300 for generating electrical power in accordance with an embodiment of the present invention. FIG. 3B is a cross-sectional view or top elevation view of the mobile device 300 for generating electrical power of FIG. 3A taken along lines 3B-3B. The device 300 may be a mobile device which compact and lightweight so that it can be easily carried by personnel for electrically powering apparatus in remote areas where other sources of electricity are unavailable. The device 300 may include a first housing portion 302 or combustion chamber and heat exchanger portion and a second housing portion 304 or fuel system and control unit housing portion.

In accordance with another embodiment of the present invention, the fuel delivery system 306 may be in a third housing portion (not shown in FIGS. 3A and 3B) and the control unit 308 and fuel 310 may be in a separate housing or the second housing portion 304. Accordingly, a third housing portion (not shown) containing the fuel delivery system may be disposed between the first housing portion 302 containing the combustion chamber and the second housing portion 304.

Referring to FIG. 3A, the mobile device 300 includes a combustion chamber 312. The device 300 may include a first hot plate 314 and a first cold plated 316. The first hot plate 314 and the first cold plate may be made from conventional metallic materials such as copper or more exotic materials such as ceramics, aluminum nitrite or similar materials capable of efficiently transferring heat. The first hot plate 314 is in thermal communication with one side of the combustion chamber 312. A first TEC module 318 or a first set of TEC modules 318 are disposed or sandwiched between the first hot plate 314 and the first cold plate 314. The first set TEC modules 318 are thermally coupled to or in thermal communication with the first hot plate 314 and the first cold plate 316 to transfer thermal energy from the first hot plate 314 to the first cold plate 316. As previously discussed a heat flux or temperature gradient across the first TEC modules 318 causes electrical power to be generated.

The mobile device 300 may also include a second hot plate 320 and a second cold plate 322. The second hot plate 320 is thermally coupled to or in thermal communication with another side of the combustion chamber 312. The second hot plate 320 may be on a substantially opposite side of the combustion chamber 312 relative to the first hot plate 314. A second TEC module 324 or a second set of TEC modules 324 are disposed or sandwiched between the second hot plate 320 and the second cold plate 322. The second set of TEC modules 324 are thermally coupled to or in thermal communication with the second hot plate 320 and the second cold plate 322 to transfer thermal energy from the second hot plate 320 to the second cold plate 322. Similarly, a heat flux or temperature gradient across the second set of TEC modules 324 causes electrical power to be generated by the second set of TEC modules 324. An example of the TEC modules 324 may be the thermal semiconductor chips available from ENECO, Inc. of Salt Lake City, Utah or another type thermal-to-electric conversion module.

A first heat sink 326 may be thermally coupled to the first cold plate 316 to receive heat transferred from the first cold plate 316. A second heat sink 328 may be thermally coupled to the second cold plate 322 to receive heat transferred from the second cold plate 322. The heat sinks 326 and 328 may each include a plurality of air cooled fins.

A layer 330 of insulation material may extend between each of the heat sinks 326 and 328 covering the ends of the combustion chamber 312, hot plates 314 and 320, TEC modules 318 and 324 and cold plates 316 and 322 to insulate the ends of these components. Each layer 330 of insulation material substantially isolates thermal energy flow through only the TEC modules 318 and 324 rather than any other possible paths through the device 300 that might result in parasitic losses.

The device 300 may also include a cooling fan 332 or blower. The fan 332 may be disposed at one end of the first housing 302. The fan 332 may draw in ambient cooling air as illustrated by arrows 334 in FIG. 3A through air inlets 336. The cooling air flows or is drawn over the heat sinks 326 and 328 by the fan 332 and absorbs heat from the heat sinks 326 and 328. The fan 332 then forces the heated air as illustrated by arrows 338 out exhaust outlets 340.

The fuel supply 310 may be a magnesium wire 342 fuel. The magnesium wire 342 may be wound on a spool 344. The fuel delivery system 306 may be a friction based magnesium wire feed system to feed the magnesium wire 342 into the combustion chamber 312. The magnesium wire feed system 306 may include a pair of wheels 346 and 348 which are biased together to hold the magnesium wire between the wheels 346 and 348. One or both wheels 346 and 348 may then be driven by an electric motor (not shown in FIGS. 3A and 3B) to force the magnesium wire fuel 342 into the combustion chamber 312. The electric motor may be powered by electricity generated by either of the TEC modules 318 and 324 similar to that previously described with respect to FIG. 2.

The control system 308 or system may be similar to the control system 200 described with reference to FIG. 2. The control system 308 may maintain a substantially constant temperature gradient across the TEC modules 318 and 322 to control the power output or provide a substantially uniform power output. The temperature gradient or ΔT between the hot and cold plates pairs 314-316 and 320-322 may be monitored and controlled by simultaneously controlling the fuel rate of fuel entering the combustion chamber 312, controlling the fan 332 cooling the heat sinks 326 and 328, and monitoring the combustion process similar to that previously described.

The device 300 may also include one or more batteries 350. The batteries 350 may power an igniter 352 to ignite the magnesium wire 342. The batteries 350 may also provide any auxiliary power as needed by any other components of the device 300.

Figure 4:
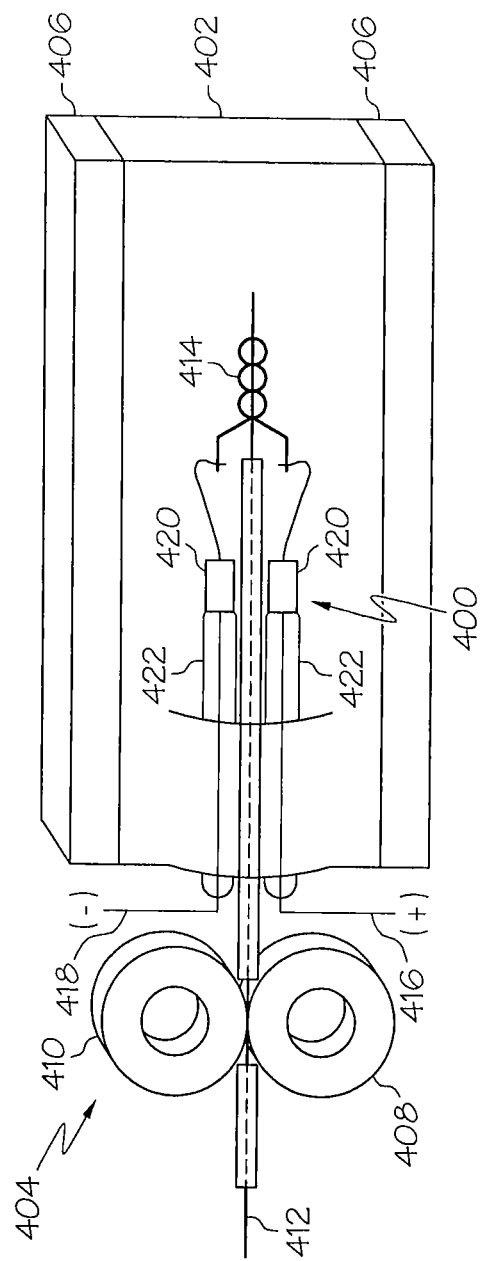
FIG. 4 is a schematic diagram of an example of an igniter in a combustion chamber being feed by a wire fuel feed system in accordance with an embodiment of the present invention.

FIG. 4 is a schematic diagram of an example of an igniter 400 in a combustion chamber 402 being feed by a wire fuel feed system 404 in accordance with an embodiment of the present invention. The igniter 400 may be used for the igniter 134 in FIG. 1 and 350 in FIGS. 3A and 3B. The combustion chamber 402 is similar to that previously described. Sides of the combustion chamber 402 may be insulated by a layer of insulation material 406. The wire fuel feed system 404 illustrated is similar to the wire feed system 306 described with reference to FIGS. 3A and 3B and may include a pair of wheels 408 and 410. One of both of the wheels 408 and 410 may be driven by an electric motor (not shown) to feed the magnesium wire fuel 412 in the combustion chamber 402.

The igniter 400 may include a beehive cathode 414. Electrical power is connected to the beehive cathode 414 by igniter positive and negative lead wires 416 and 418 to generate a spark across a spark gap to ignite the wire fuel 412 in the combustion chamber 402. The igniter lead wires 416 and 418 may be protected from the high heat in the combustion chamber 402 by ceramic beads 420 and Borate glass sleeves 422.

Figure 5:
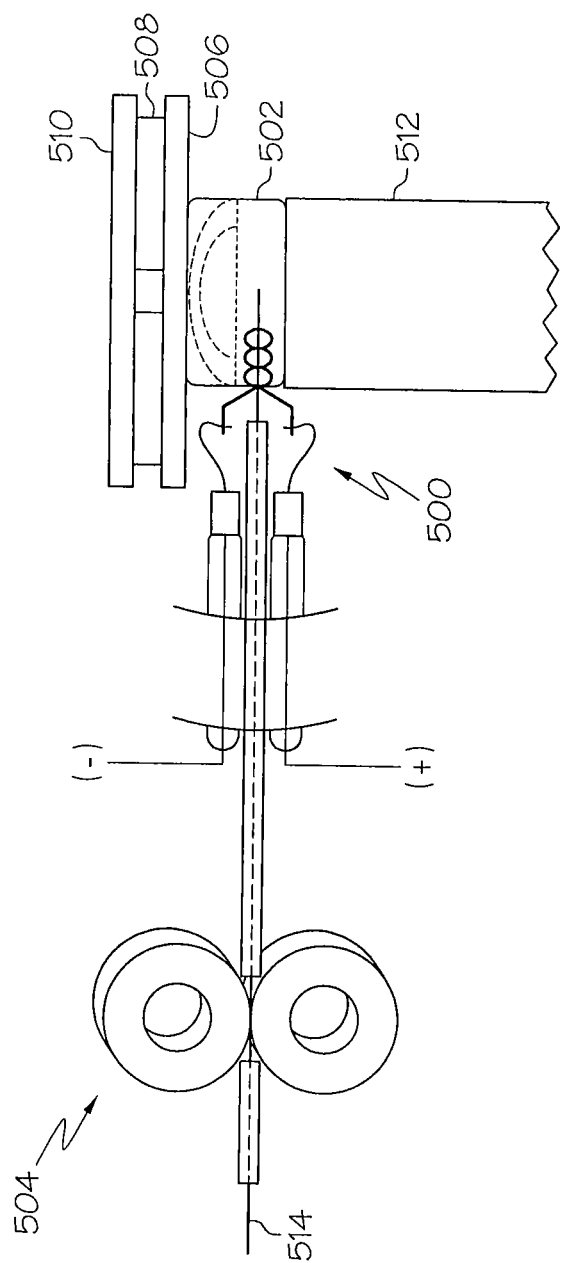
FIG. 5 is a schematic diagram of an example of an igniter in a combustion chamber being feed by a wire fuel feed system in accordance with another embodiment of the present invention.

FIG. 5 is a schematic diagram of an example of an igniter 500 in a combustion chamber 502 being feed by a wire fuel feed system 504 in accordance with another embodiment of the present invention. The igniter 500 may have a similar structure to that previously described in FIG. 4 and the wire fuel feed system 504 may also be the same as that described with respect to FIG. 5. A hot spreader plate 506 may be in thermal communication with the combustion chamber 502. A set of TEC modules 508 may be sandwiched between the hot spreader plate 506 and a cold spreader plate 510. Similar to that previously discussed the temperature differential (ΔT) between the hot spreader plate 506 and the cold spreader plate 510 causes a heat flux across the TEC modules 508 which can generate electrical energy.

In accordance with the embodiment of the invention illustrated in FIG. 5, a slag chute 512 may be positioned to permit slag created by combustion of magnesium wire fuel 514 to drop from the combustion chamber 502.

Figure 6A:
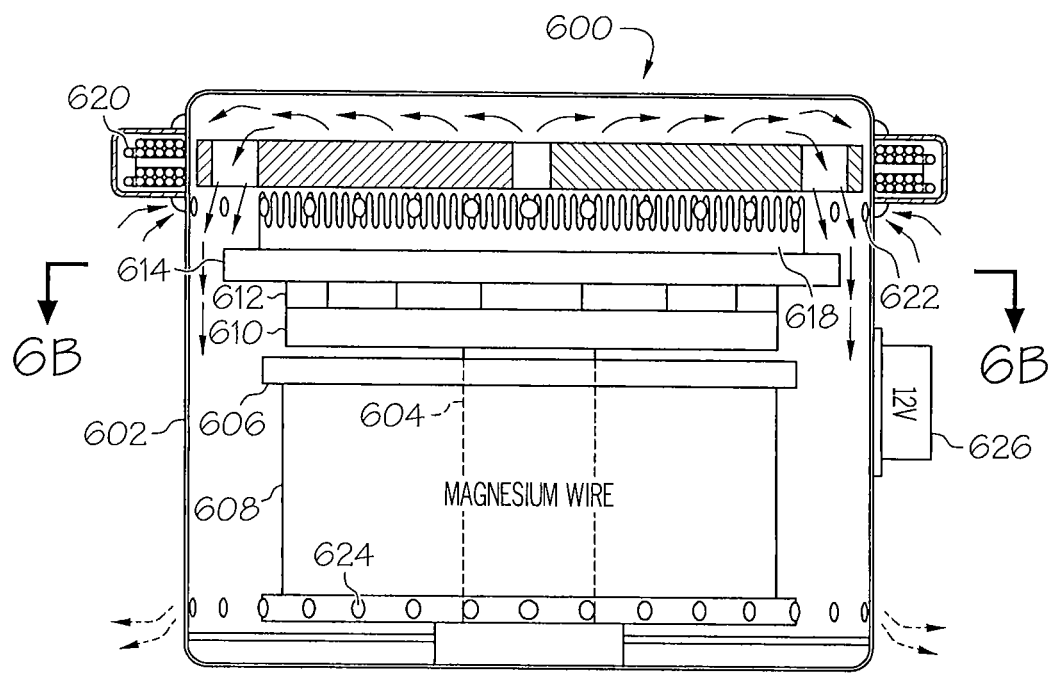
FIG. 6A is a side elevation view of an example of a device for generating electrical power in accordance with another embodiment of the present invention.

FIG. 6A is a side elevation view of an example of a mobile device 600 for generating electrical power in accordance with another embodiment of the present invention. The device 600 may include a substantially cylindrically shaped housing 602. The housing 602 may be made from a high heat resistant and heat insulating material. For example, the housing 602 may be made from a conventional metallic material such as sheet steel. The device 600 may include a combustion chamber 604 positioned substantially in a center portion of the housing 602. The combustion chamber 604 may be made from a high heat resistant material, such as aluminum nitrite or similar material. The combustion chamber 604 may also be substantially cylindrically shaped. The combustion chamber 604 may extend through the center of a spool 606 of magnesium wire fuel 608. A magnesium wire fuel delivery system (not shown in FIG. 6A for purposes of clarity) similar to that previously described, may controllably feed the magnesium wire 608 into the combustion chamber 604 to control the level of electrical power generated by the device 600.

Figure 6B:
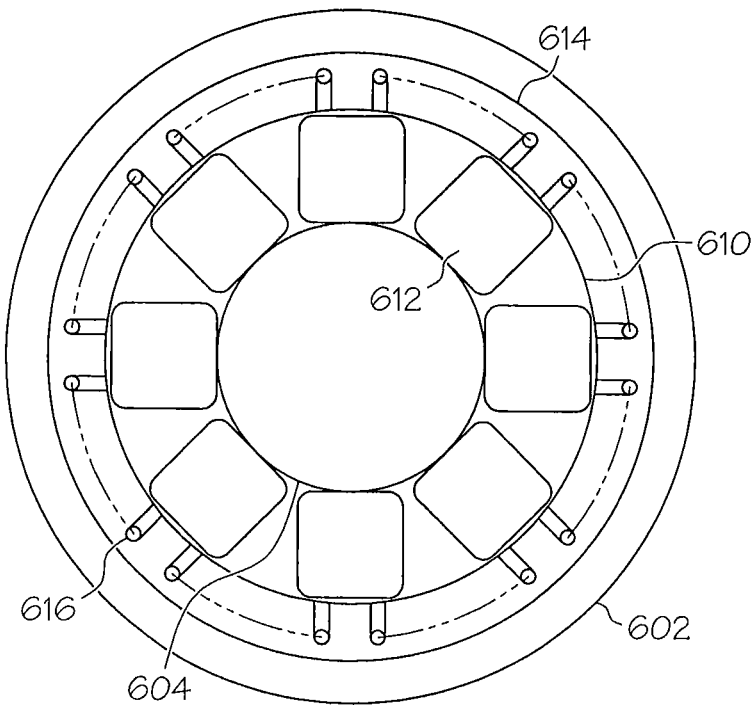
FIG. 6B is a top elevation view the device for generating electrical power of FIG. 7B illustrating the combustion chamber and associated device elements.

A hot spreading plate 610 may be disposed in thermal communication with the combustion chamber 604. A plurality of TEC modules 612 may be sandwiched between the hot plate 610 and a cold spreading plate 614. The hot plate 610 and the cold plate 614 may be made from materials similar to that previously described. Referring also to FIG. 6B, FIG. 6B is a top elevation view and cross-sectional view the mobile device 600 for generating electrical power in FIG. 6A taken along lines 6B-6B. FIG. 6B illustrates the combustion chamber 604 and the TEC modules 612 substantially uniformly distributed relative to the combustion chamber 604. Electrical wires 616 are connected to the TEC modules 612 for conducting the electrical power generated by the TEC modules 612 for powering an electrical apparatus (not shown in FIGS. 6A and 6B).

A heat sink 618 may be disposed in thermal communication with the cold spreading plate 614. The heat sink 618 may include a plurality of cooling fins. A cooling fan 620 may draw ambient cooling air into the housing 602 through a multiplicity of air inlets 622 formed in the housing 602. The air inlets 622 may be formed in a upper portion of the housing 602. The fan 620 causes the cooling air to flow through the cooling fins of the heat sink 618 to absorb heat from the heat sink 618. The heated air may then be expelled through exhaust outlets 624 formed in the housing 602. The exhaust outlets 624 may be formed in a lower portion of the housing 602. The fan 620 may be a tip-magnetic fan, magnetically levitated fan or other type fan or blower.

A battery 626 may be mounted to the exterior of the housing 602. The battery 626 may provide power to an igniter (not shown in FIGS. 6A and 6B for purposes of clarity). The igniter may be similar to igniter 400 and 500 described with reference to FIGS. 4 and 5.

Figure 7A:
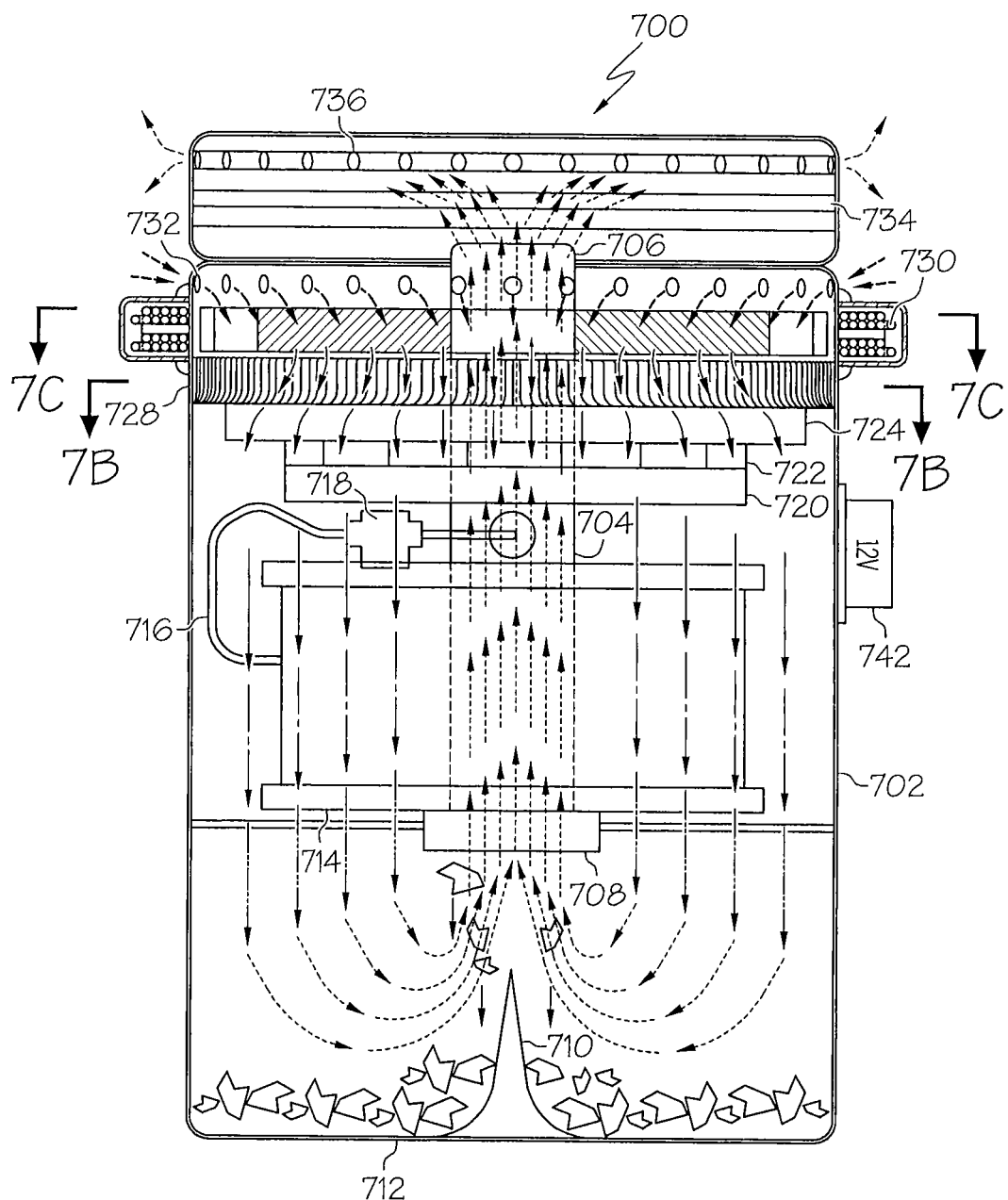
FIG. 7A is a side elevation view of an example of a device for generating electrical power in accordance with another embodiment of the present invention.

FIG. 7A is a side elevation view of an example of a mobile device 700 for generating electrical power in accordance with another embodiment of the present invention. The device 700 may include a substantially cylindrically shaped housing 702. The housing 702 may be made from a similar material as the housing 602 in FIG. 6. A bird's nest combustion chamber 704 may be disposed substantially in a center portion of the housing 702. As described in more detail herein, the bird's nest combustion chamber 704 may be characterized as also being substantially cylindrical in shape. A chimney 706 may connect to an upper portion of the combustion chamber 704 to exhaust hot combustion gases from the combustion chamber 704. A slag chute 708 may connect to a lower portion of the combustion chamber 704 to permit slag formed by combustion of magnesium wire fuel to drop out from the combustion chamber 704 and collect in a lower portion of the housing 702. A divider 710 extending from a base 712 of the housing 702 may prevent the slag from building up immediately below the slag chute 708 and possibly blocking the slag chute 708 which also permits combustion air into the combustion chamber 704. The slag chute 708 and the chimney 706 may be extensions of one another with the combustion chamber 704 disposed there between.

The slag chute 708 may extend through the center of a spool 714 of magnesium wire 716 for fuel. A wire fuel delivery system 718 may feed the magnesium wire 716 into the combustion chamber 704 at a controlled rate similar to that previously described to control combustion in the combustion chamber 704 and the electrical power generated by the mobile device 700. The wire fuel delivery system 718 may be similar to those friction based wire feed systems previously described. Similar to that previously described, the feed rate of the magnesium wire 716 may be adjusted by a thermal management system and control unit similar to system 200 described with reference to FIG. 2.

Figure 7B:
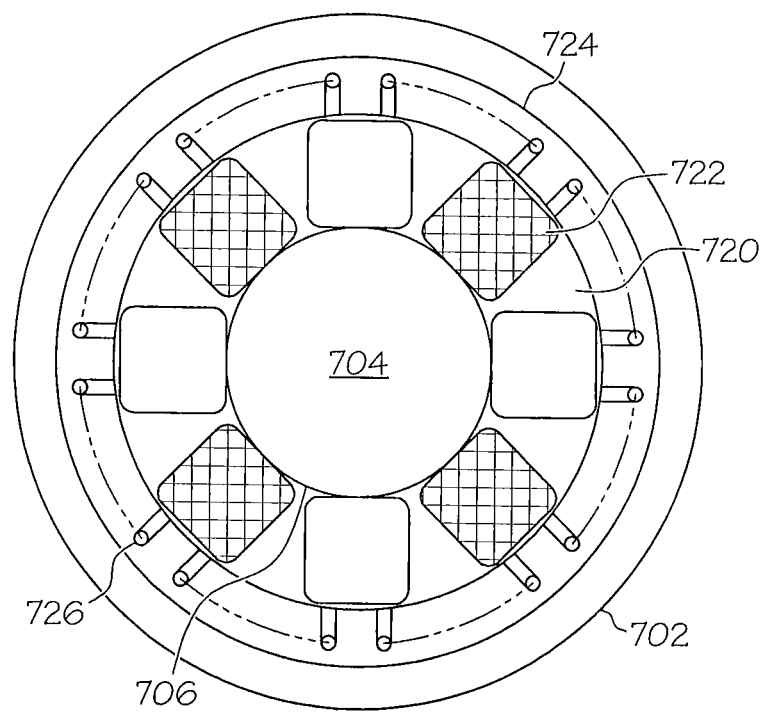
FIG. 7B is a top elevation view the device for generating electrical power of FIG. 7A showing the combustion chamber and associated elements of the device.

A hot plate 720 is thermally coupled to the combustion chamber 704 to be in thermal communication therewith. A plurality of TEC modules 722 are sandwiched between the hot plate 720 and a cold plate 724. Referring also to FIG. 7B, FIG. 7B is a top elevation view the mobile device 700 of FIG. 7A showing the combustion chamber 704 and the plurality of TEC modules 722 distributed substantially uniformly about the combustion chamber 704 and chimney 706. An opening is formed in the hot plate 720 and the cold plate 724 to permit the chimney 706 to extend there through. FIG. 7B also illustrates the electrical wiring 726 to conduct the electrical power generated by the TEC modules 722 for use by an external apparatus.

A heat sink 728 may be thermally coupled to the cold plate 724 to transfer heat from the cold plate 724. The heat sink 728 may include a plurality of cooling fins extending therefrom.

The device 700 may also include a cooling fan 730 to cause ambient cooling air to flow through the cooling fins of the heat sink 728 to remove heat from the device 700. The cooling fan 730 may be a large air gap (LAG) electric ring motor powered levitated fan. The armature (stator winding) of the motor may be placed outside the thermal chamber in cool ambient conditions to improve electrical efficiency and motor reliability. A magnetic tipped fan (rotor) is a passive structure and may be located inside the mobile TEC device 700 where extreme temperatures may be possible. Since the LAG fan 730 draws energy directly from the output of the TEC modules 722, efficiency is optimized by keeping the fan rotor cool. A levitated fan eliminates a central shaft which would include bearings that require lubrication and potentially less reliability than the levitated fan 730 of the embodiment of the present invention illustrated in FIG. 7.

Figure 7C:
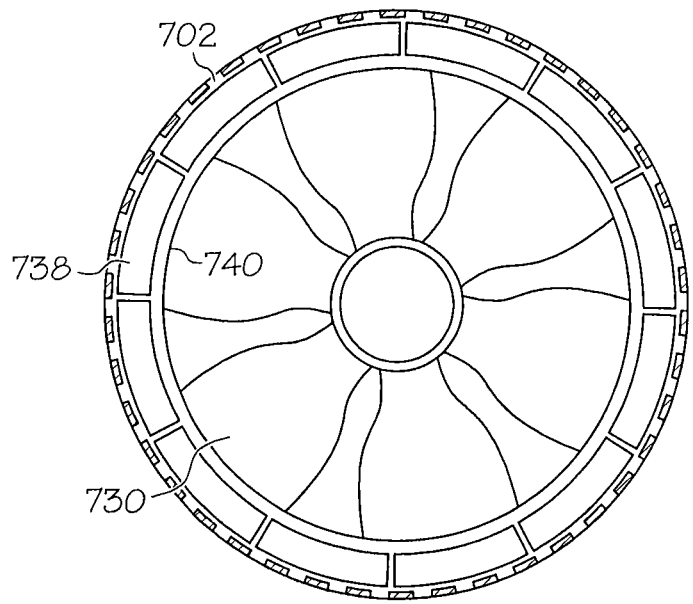
FIG. 7C is a top elevation view the device for generating electrical power of FIG. 7A showing the levitated cooling fan.

Referring also to FIG. 7C, FIG. 7C is a top elevation view the mobile device 700 for generating electrical power of FIG. 7A showing the levitated cooling fan 730. The fan 730 may draw ambient air into the housing 702 through air inlets 732 formed in the housing 702. The fan 730 forces the ambient cooling air across the cooling fins of the heat sink 728. The air is then heated by the heat sink 728 and is forced by the fan 730 to flow toward the lower portion of the housing 702 where the heated air is forced up the slag chute 708. The heated air results in a more efficient combustion of the magnesium wire 716 in the combustion chamber 704. The hot combustion gases are then exhausted up the chimney 706. The chimney 706 may be connected to an HEPA filter 734. The HEPA filter 734 filters the hot exhaust gases before the gases are expelled in the outside air through exhaust outlets 736.

A plurality of return air opening 738 may be formed between the fan casing 740 and an interior wall of the housing 702 to permit air to return through the heat sink 728.

The device 700 may also include a battery 742 to provide electrical power for an igniter (not shown in FIG. 7A) any other components that may not receive electrical power from the TEC modules 722. The battery 742 may be mounted to an exterior wall of the housing 702.

Figure 8:
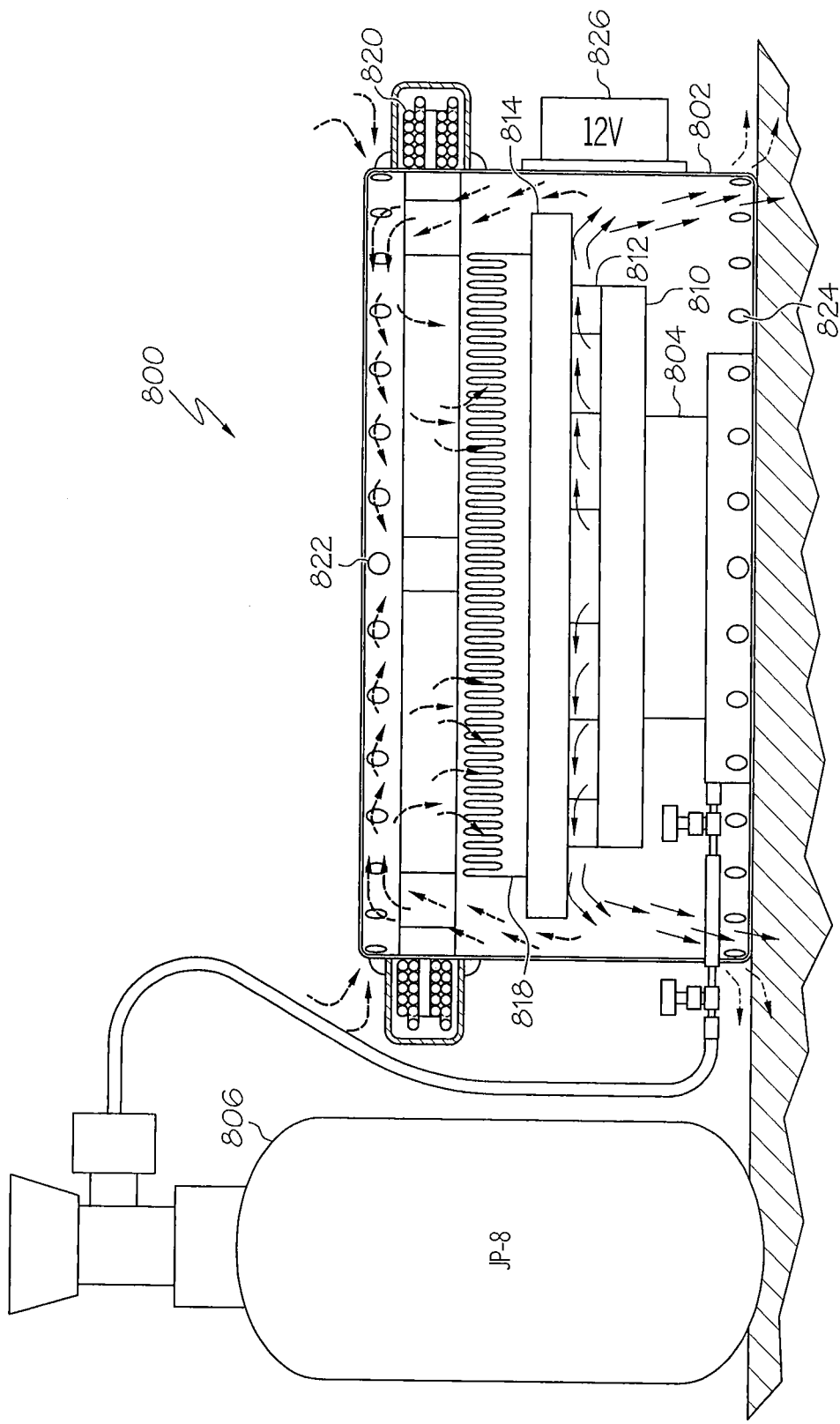
FIG. 8 is a side elevation view of an example of a device for generating electrical power in accordance with another embodiment of the present invention.

FIG. 8 is a side elevation view of an example of a mobile device 800 for generating electrical power in accordance with another embodiment of the present invention. The device 800 may include a substantially cylindrical housing 802. The housing 802 may be made from a high-heat resistant and heat insulating material similar to that previously described with respect to the housing 602 of FIG. 6. The device 600 may include a combustion chamber 804 positioned substantially in a center portion of the housing 802. The combustion chamber may be made from a high heat resistant material similar to that previously described with respect to the combustion chamber 604. The combustion chamber 804 may also be substantially cylindrically shaped. Fuel 806 for the combustion chamber 804 for the combustion chamber 804 may come from a source external from the device 800. In the embodiment of the present invention illustrated in FIG. 8, an external source of gas, such as a bottle of JP-8 (Jet Propellant formula 8) or other fuel, may feed fuel to the combustion chamber 804. The rate of fuel entering the combustion chamber 804 may also be controlled to control the electrical power generated by the device 800 similar to that previously described.

A hot spreading plate 810 may be disposed in thermal communication with the combustion chamber 804. A plurality of TEC modules 812 may be sandwiched between the hot plate 810 and a cold spreading plate 814. The TEC modules 812 may be substantially uniformly distributed relative to the combustion chamber 604 similar to that previously illustrated and described with reference to FIGS. 6B and 7B.

A heat sink 818 may be disposed in thermal communication with the cold spreading plate 814. The heat sink 818 may include a plurality of cooling fins. A cooling fan 820 may draw ambient cooling air into the housing 802 through a multiplicity of air inlets 822 formed in the housing 802. The air inlets 822 may be formed in an upper portion of the housing 802. The fan 820 causes the cooling air to flow through the cooling fins of the heat sink 814 to absorb heat from the heat sink 814. The heated air may then be expelled through exhaust outlets 824 formed in the housing 802. The exhaust outlets 824 may be formed in a lower portion of the housing 802. The fan 820 may be a tip-magnetic fan or magnetically levitated fan similar to that previously described.

A battery 826 may be mounted to the exterior of the housing 802. The battery 826 may provide power to an igniter (not shown in FIG. 8 for purposes of clarity). The igniter may be similar to igniter 400 and 500 described with reference to FIGS. 4 and 5.

Figure 9:
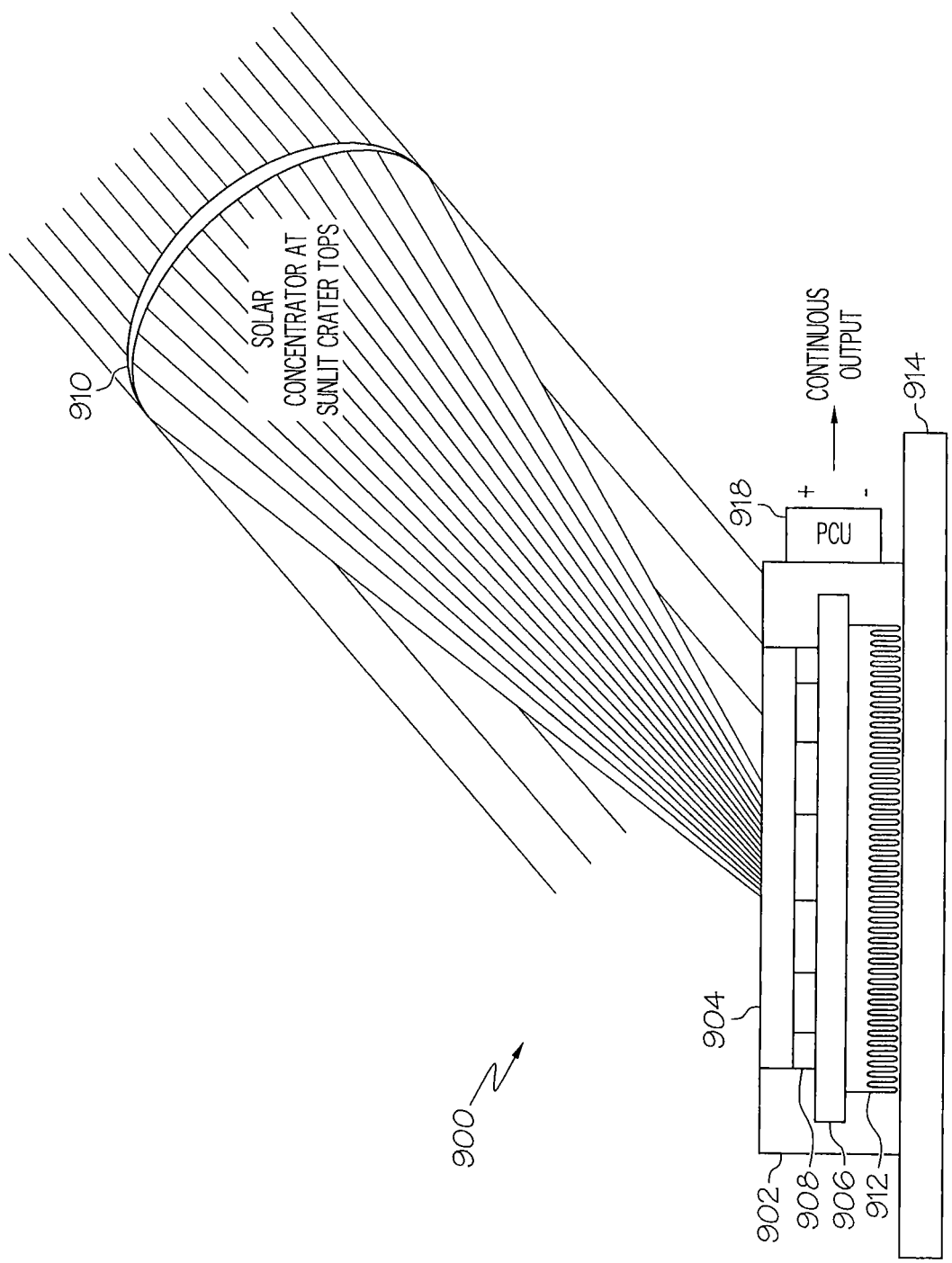
FIG. 9 is a side elevation view of an example of a device for generating electrical power in accordance with an additional embodiment of the present invention.

FIG. 9 is a side elevation view of an example of a mobile device 900 for generating electrical power in accordance with an additional embodiment of the present invention. The device 900 may provide power substantially indefinitely for space exploration purposes. The device 900 may include a housing 902. The housing 902 may be substantially cylindrically shaped and may be similar to the housings previously described. The device 900 may include a hot plate 904 and a cold plate 906. A plurality of TEC modules 908 may be sandwiched between the hot plate 904 and the cold plate 906. Solar energy or light from the Sun may be concentrated on the hot plate 904 by a solar concentrator 910. The cold plate 906 may be thermally coupled to a heat sink 912. Thus, a temperature gradient may be created across the TEC modules 908 to cause the modules to generate electrical power similar to that previously described. A liquid filled radiator blanket 914 may be positioned between the device 900 or the heat sink 912 and a planetary surface or lunar surface 916. The liquid filled radiator blanket 914 may transfer heat from the heat sink 912 in the planetary or lunar surface 916. The device 900 may also include a programmable control unit (PCU) 918. The PCU 918 may control the level of electrical power supplied by the device 900 to any apparatus being electrically powered by the device 900.

Figure 10:
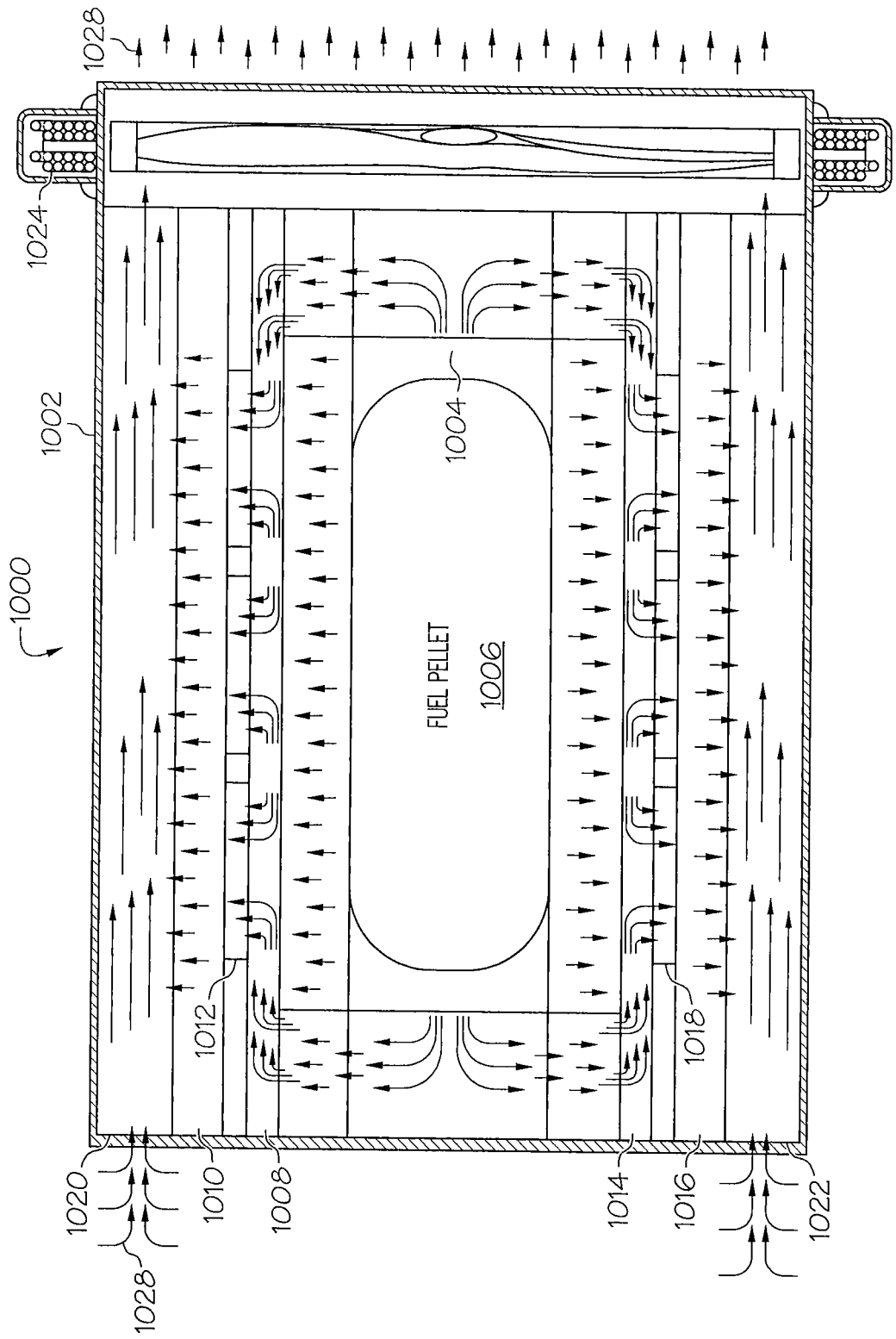
FIG. 10 is a side elevation view of an example of a device for generating electrical power in accordance with a further embodiment of the present invention.

FIG. 10 is a side elevation view of an example of a device 1000 for generating electrical power in accordance with a further embodiment of the present invention. The device 1000 may include a housing 1002. The housing 1002 may be made from a high-heat resistant and insulating material or materials similar to that previously described. A combustion chamber 1004 may be disposed within the housing 1002. The combustion chamber 1004 may be made from a high-heat resistant material similar to that previously described. The fuel for the device may be a radioactive fuel pellet 1006 contained in the combustion chamber 1004.

The device 1000 may include a first hot plate 1008 and a first cold plated 1010. The first hot plate 1008 is in thermal communication with one side of the combustion chamber 1004. A first TEC module or a first set of TEC modules 1012 are disposed or sandwiched between the first hot plate 1010 and the first cold plate 1010. The first set TEC modules 1012 are thermally coupled to or in thermal communication with the first hot plate 1008 and the first cold plate 1010 similar to that previously described to transfer thermal energy from the first hot plate 1008 to the first cold plate 1010. As previously discussed a heat flux or temperature gradient across the first TEC modules 1012 causes electrical power to be generated.

The device 1000 may also include a second hot plate 1014 and a second cold plate 1016. The second hot plate 1014 is thermally coupled to or in thermal communication with another side of the combustion chamber 1004. The second hot plate 1014 may be on a substantially opposite side of the combustion chamber 1004 relative to the first hot plate 1012. A second TEC module or a second set of TEC modules 1018 are disposed or sandwiched between the second hot plate 1014 and the second cold plate 1016. The second set of TEC modules 1018 are thermally coupled to or in thermal communication with the second hot plate 1014 and the second cold plate 1016 to transfer thermal energy from the second hot plate 1014 to the second cold plate 1016. Similarly, a heat flux or temperature gradient across the second set of TEC modules 1018 causes electrical power to be generated by the second set of TEC modules 1018.

A first heat sink 1020 may be thermally coupled to the first cold plate 1010 to receive heat transferred from the first cold plate 1010. A second heat sink 1022 may be thermally coupled to the second cold plate 1016 to receive heat transferred from the second cold plate 1016. The heat sinks 1020 and 1022 may each include a plurality of air cooled fins.

The device 1000 may also include a cooling fan 1024. The fan 1024 may be disposed at one end of the first housing 302. The fan 1024 may be a tip-magnetic fan, similar to that previously discussed, or some other type of fan. The fan 1024 may draw in ambient cooling air as illustrated by arrows 1026 in FIG. 10. The cooling air 1026 flows or is drawn over the heat sinks 1020 and 1022 by the fan 1024. The ambient cooling air absorbs heat from the heat sinks 1020 and 1022. The fan 1024 then forces the heated air as illustrated by arrows 1028 out exhaust outlets.

Figure 11:
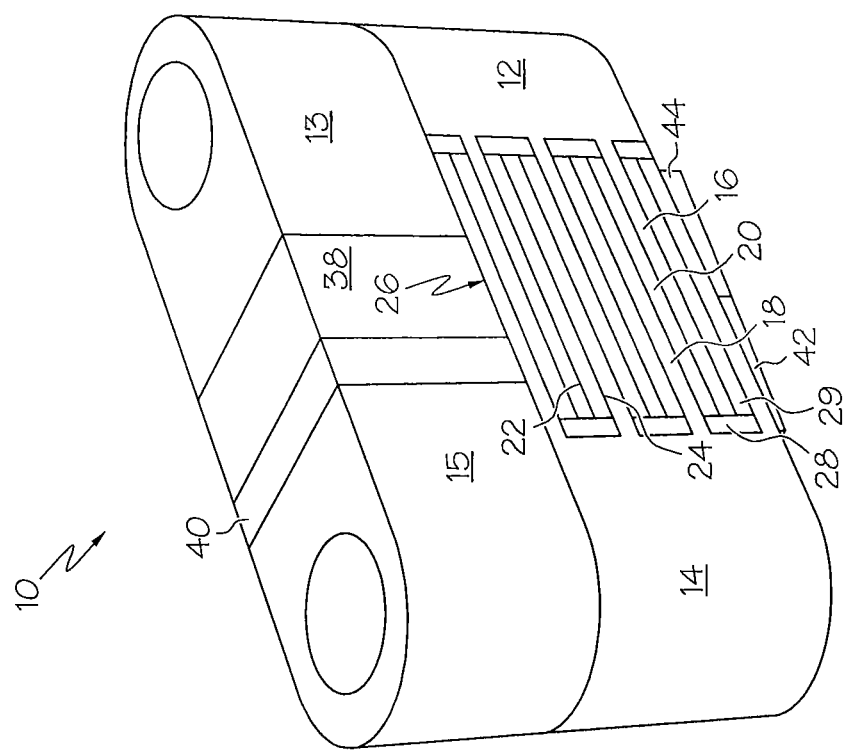
FIG. 11 is a perspective view of an example of a device for generating electrical power in accordance with a further embodiment of the present disclosure.

FIG. 11 is a perspective view of a device 10 for generating electrical power in accordance with an embodiment of the present disclosure. The device 10 includes a heat pipe stack 12 and a cold pipe stack 14. The heat pipe stack 12 is in thermal communication with a heat source 13. Examples of the heat source 13 may include a combustion chamber, magnesium burner or any heat source that is compact and light weight. The heat source may also include a solar based heat source. The cold pipe stack 14 is in thermal communication with a cold source 15. Examples of the cold source 15 may include a cooling fan to exhaust to the atmosphere, a heat sink or other device. The cold source 15 may also just be a surface area exposed to the air or atmosphere or a vent to air. It should be noted that other devices for generating heat such as a combustion chamber may be used in lieu of the magnesium burner 13. Also, the cooling fan 15 may be substituted with other known means to remove heat from a space.

Figure 12:
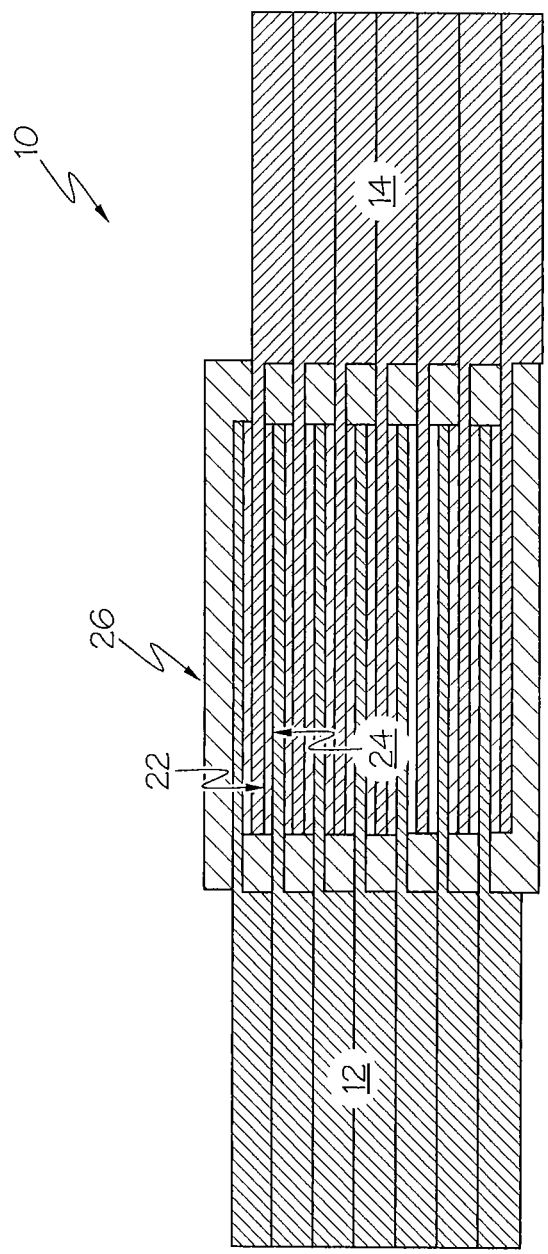
FIG. 12 is a cross-sectional view of a portion of the device of FIG. 11 illustrating a thermoelectric stack in accordance with an embodiment of the present disclosure.

Referring also to FIG. 12, FIG. 12 is a cross-sectional view of a portion of the device 10 of FIG. 11 illustrating a thermoelectric stack 26 in accordance with an embodiment of the present disclosure. The thermoelectric stack 26 includes a series of thermal elements, such as heat pipes 16, cold pipes 18, and thermoelectric generators 20 or plates in a particular order. In one embodiment, the heat pipes 16 and cold pipes 18 may be nano pipes, nano tubes or the similar thermal elements The heat 16 and cold pipes 18 are to be made of anything that is thermally conductive such as copper, aluminum nitride or the like. As shown in FIG. 12, the heat pipes 16 extend outwardly in a parallel fashion from the heat source 13 in at least one direction. The heat pipes 16 are thermally coupled to the heat source 13 in such a way as to ensure effective heat transfer from the heat source to and through the heat pipes 16. Similarly as shown in 13, the cold pipes 18 extend from the cold source 14 in a parallel fashion and in an opposed direction to the heat pipes 16 so that the cold pipes and heat pipes overlap when the device is assembled. The cold pipes 18 are thermally coupled to the cold source 14 in such a way as to ensure effective heat loss from the cold pipes to and through the cold source so as to maintain a low temperature relative to the heat pipe 16.

Sandwiched between each heat pipe 16 and cold pipe 18 in the stack 26 is a thermoelectric generator 20, as shown in FIG. 12. Each thermoelectric generator 20 has a hot side surface 22 and a cold side surface 24. The hot side surface 22 is in thermal contact with the heat pipe 16. The cold side surface 24 is in thermal contact with the cold pipe 18. The thermoelectric generator 20 creates electrical power from the heat flow across a structure. One type of thermoelectric generator is a solid state thermoelectric converter made by ENECO, Inc. If the thermal gradient (difference in temperature between the heat source 12 and cold source 14) increases, the flow of heat across a structure increases and thus a greater amount of electrical power or energy may be generated. At a minimum, a stack 26 would include at least one heat pipe 16 and at least one cold pipe 18 with a thermoelectric generator 20 sandwiched in between. Moreover, it is preferred that the hot side surface 22 and the heat pipe 16 be made of materials having coefficients of thermal expansion that differ by no more than 10%. Similarly, it is preferred that the cold side surface 24 and the cold pipe be made of materials having coefficients of thermal expansion that differ by no more than 10%. When the coefficients of thermal expansion are similar between the hot 22 and cold side 24 surfaces and the heat 16 and cold pipes 18, the device 10 functions more effectively because the interaction between the surfaces (cold pipe and cold side, and heat pipe and hot side surface) expand and contract at similar rates so the heat transfer is more efficient.

The stack 26 arrangement of heat pipes 16, cold pipes 18 and thermoelectric generators 20 enables the device 10 to be arranged in a compact manner while generating greater levels of electrical power or energy than presently provided by existing systems. Moreover, the stacking arrangement of the exemplary embodiment of the present disclosure illustrated in the Figures allows for a greater heat flow across each thermoelectric generator 20 and increases the effectiveness of each generator 20 and the device 10 as a whole. Thus, the device 10 of the illustrated embodiment of the present disclosure enables a greater amount of electrical power or energy to be generated while enabling the size and weight of the device 10 to decrease.

Returning to FIG. 11, insulating material 28 is positioned between the cold pipes 18 and the hot heat pipes 16. The insulating material 28 inhibits the transfer of heat from the hot heat pipe 16 directly to the cold pipe 16. By preventing heat flow between the heat pipe 16 and cold pipe 18 outside the stack 26, the insulating material 28 further enables the device 10 to more effectively produce a greater amount of electricity. The insulating material 28 may include an alumina enhanced thermal barrier or similar insulating material. A thermal chip module layer 29 may be embedded in the alumina enhanced thermal barrier.

A power conditioner and plug 38 or outlet are electrically connected to the thermoelectric generators 20 of the device 10 so as to provide the user with a way of transferring or supplying the electrical power from the device 10 to the user's electronic device.

A control module 40 may also be associated with the device 10 to control the operation of the device 10. The set of control functions to be considered may include: controlling the rate of fuel to be combusted to produce the heat source for the hot side. In particular, the control module 40 may regulate the burn rate of the magnesium or other fuel in such a way in order to maintain the proper temperatures and thermo gradients in the device 10 for effective operation. Additional control functions may include controlling the operation of fans for cooling the cold side, and controlling the level of voltage to be generated for interfacing with intended application device.

The device 10 further includes a warm start battery 42 and a cold start module 44. The warm start battery stores enough energy to add and ignite fuel for a hot system restart after the system has been turned off for a period of time. The cold start module can be a hand crank generator which charges the warm start battery 42. It allows the start of the device 10 if battery 42 is discharged.

In a one embodiment, it is anticipated that the overall dimensions of the device 10 would be about 74 mm high, 125 mm wide and 43 mm thick, and would include six layers of thermoelectric generators capable of generating a total of 300 watts of power from the device 10. It is appreciated that the dimensions would vary with changes to design, function and power generating capability of the device 10.

Figure 13:
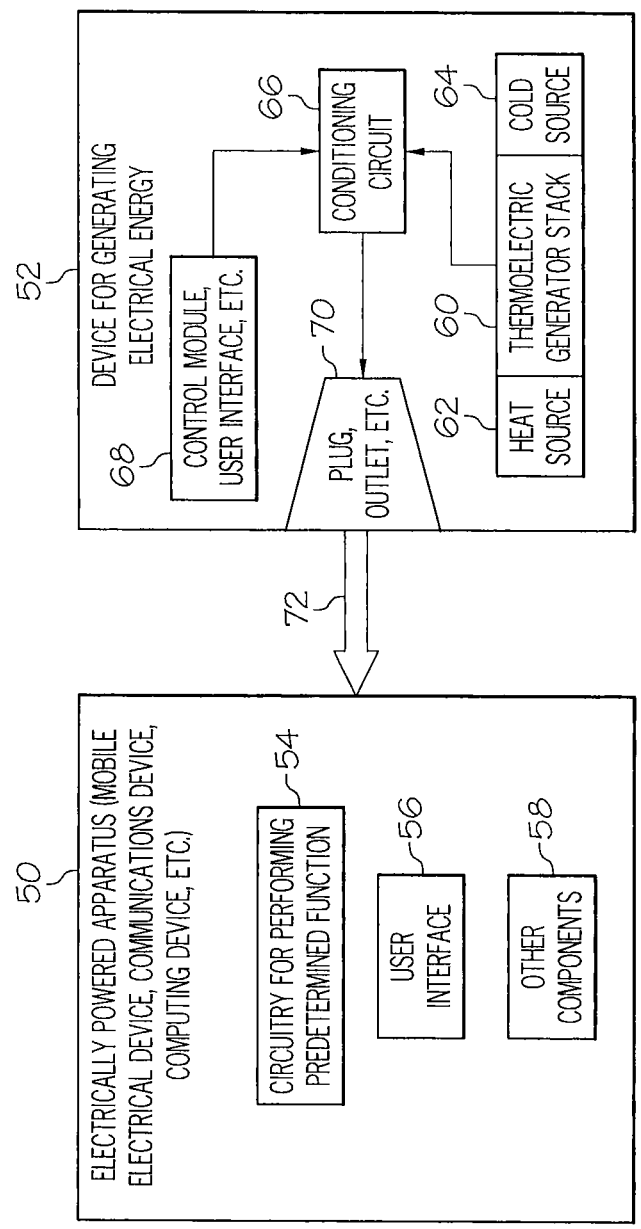
FIG. 13 is a block diagram of an example of an electrically powered apparatus powered by a device for generating electrical power in accordance with an embodiment of the present disclosure.

FIG. 13 is a block diagram of an example of an electrically powered apparatus 50 powered by a device 52 for generating electrical power in accordance with an embodiment of the present disclosure. The electrically powered apparatus 50 may be a mobile or portable electrically powered device that heretofore may have been powered by an electric storage battery or other electricity storage device. The electrically power apparatus 50 may be communications device, computing device or other electrical device.

The electrically powered apparatus 50 may include circuitry 54 for performing a predetermined function. For example in the case of a communications device, the circuitry 54 may include a transmitter and a receiver. The apparatus 50 may also include a user interface 56 to permit a user to control the device. The interface 56 may include a keypad, keyboard, computer pointing device or mouse, display or any other means to permit a user to operate and control the apparatus 50. The electrically powered apparatus 50 may also include other components, such as a data storage device, file system, processing unit or the like.

The device 52 for generating electrical energy of power may be similar to the device 10 in FIG. 11. The device 52 may include a thermoelectric generator stack 60. The thermoelectric generator stack 60 may be similar to the generator stack 26 in FIGS. 11 and 12 and may operate in a substantially similar manner. The thermoelectric stack 60 may be thermally coupled to a heat source 62 and a cold source 64 to create a thermal gradient across the thermoelectric generators or plates in the thermoelectric stack 60 to generate electrical energy.

Electrical energy generated by the thermoelectric stack 60 may be conditioned by a conditioning circuit 66. The conditioning circuit 66 may be controlled by a control module 68 so that the appropriate voltage and current levels are supplied to the electrically powered apparatus 50. The control module 68 may include a user interface or the interface may be separate from the control module 68 to permit a user to select the appropriate voltage and current and any other parameters associated with the electrical power to be supplied to the apparatus 50.

The device 52 may also include a plug, outlet or similar means for supplying the electrical power to the apparatus 50. An electrical cable or power cord 72 may also be provided to connect the device 52 to the apparatus 50. In another embodiment of the present disclosure, the device 52 may be integrated into the apparatus 50.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," and "includes" and/or "including" when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A mobile device for generating electrical power, comprising:
    a combustion chamber;
    a heat sink;
    a thermal-to-electric conversion (TEC) module in thermal communication with the combustion chamber and the heat sink to transfer thermal energy from the combustion chamber to the heat sink, wherein a heat flux across the TEC module causes electrical power to be generated;
    a first housing portion enclosing the combustion chamber, the heat sink and the TEC module;
    a fuel supply;
    a fuel delivery system to feed fuel into the combustion chamber;
    a control system to at least monitor and control delivery of fuel to the combustion chamber by the fuel delivery system and to control a temperature gradient across the TEC module to control the electrical power produced by the TEC module, wherein the control system comprises a control unit;
    a second housing portion comprising an elongated body extending from one side of the first housing portion, the second housing portion enclosing the fuel delivery system at one end of the elongated body proximate to the first housing portion, the control unit at an opposite end of the elongated body from the fuel delivery system and the fuel supply disposed between the fuel delivery system and the control unit; and
    a layer of insulation at an end of the first housing between the combustion chamber and the second housing, wherein the fuel supply is a magnesium wire fuel supply, and wherein the fuel delivery system comprises a magnesium wire feed system to feed the magnesium wire into the combustion chamber, wherein the control system adjusts a feed rate of the magnesium wire to maintain a substantially constant temperature gradient across the TEC module to provide a substantially uniform power output.

2. The mobile device of claim 1, further comprising:
    a fan disposed at an opposite side of the first housing portion from the second housing portion to remove heat from the heat sink; and
    wherein the control unit simultaneously controls the fan and a feed rate of fuel into the combustion chamber that causes a substantially constant temperature gradient across the TEC module and generates a substantially uniform power output from the device.

3. The mobile device of claim 1, wherein the magnesium wire feed system is a friction based feed system and wherein the device further comprises an electric spark gap igniter to ignite the magnesium wire.

4. A mobile device for generating electrical power, comprising:
    a combustion chamber;
    a first hot plate in thermal communication with one side of the combustion chamber;
    a first cold plate;
    a first TEC module disposed between the first hot plate and the first cold plate and in thermal communication with the first hot plate and the first cold plate to transfer thermal energy from the first hot plate to the first cold plate, wherein a heat flux across the first TEC module causes electrical power to be generated;
    a second hot plate in thermal communication with another side of the combustion chamber;
    a second cold plate;
    a second TEC module disposed between the second hot plate and the second cold plate and in thermal communication with the second hot plate and the second cold plate to transfer thermal energy from the second hot plate to the second cold plate, wherein a heat flux across the second TEC module causes electrical power to be generated and wherein the only second TEC module is on an opposite side of the combustion chamber from the first TEC module;

a first housing portion enclosing the combustion chamber, the first hot plate, the first cold plate, the first TEC module, the second hot plate, the second cold plate and the second TEC module;

a magnesium wire fuel supply;

a magnesium wire feed system to feed the magnesium wire into the combustion chamber;

a control system to maintain a substantially constant temperature gradient across the TEC modules to provide a substantially uniform power output, wherein the control system comprises a control unit;

a second housing portion comprising an elongated body extending from one side of the first housing portion, the second housing portion enclosing the magnesium wire feed system at one end of the elongated housing proximate to the first housing portion, the control unit at an opposite end of the elongated body from the magnesium wire feed system and the magnesium wire fuel supply disposed between the magnesium wire feed system and the control unit; and a layer of insulation at an end of the first housing between the combustion chamber and the second housing.

5. The mobile device of claim 4, further comprising:

a first heat sink to receive heat transferred from the first cold plate;

a second heat sink to receive heat transferred from the second cold plate;

a fan to cause ambient cooling air to flow across the first and second heat sinks.

6. The mobile device of claim 5, wherein the control system comprises a thermal management system to control a feed rate of the magnesium wire fuel into the combustion chamber and to control the fan to maintain a substantially constant temperature gradient across the TEC modules to provide a substantially uniform power output from the device.

7. The mobile device of claim 1, wherein the fuel delivery system comprises a pair wheels which are biased together to hold the magnesium wire between the pair of wheels, wherein at least one of the pair of wheels is driven by an electric motor to feed the magnesium wire into the combustion chamber.

8. The mobile device of claim 3, further comprising a slag chute positioned to remove slag created by combustion of the magnesium wire.

9. The mobile device of claim 1, further comprising a third housing portion, wherein the third housing portion encloses the fuel delivery system.

10. The mobile device of claim 2, further comprising:

a plurality of air inlets in the one side of the first housing portion opposite the fan; and a plurality of exhaust outlets in the opposite side of the first housing from the second housing.

* * * * *

UNITED STATES PATENT AND TRADEMARK OFFICE
CERTIFICATE OF CORRECTION

PATENT NO. : 8,519,254 B2
APPLICATION NO. : 12/099291
DATED : August 27, 2013
INVENTOR(S) : James Ping Huang et al.

It is certified that error appears in the above-identified patent and that said Letters Patent is hereby corrected as shown below:

In the Claims:

Column 17, line 1, change "generated and wherein the only second TEC module is" to --generated and wherein the second TEC module is--.

Signed and Sealed this
Eighth Day of October, 2013

Teresa Stanek Rea
*Deputy Director of the United States Patent and Trademark Office*